US012632688B2

(12) United States Patent
Deng et al.

(10) Patent No.: US 12,632,688 B2
(45) Date of Patent: May 19, 2026

(54) FREQUENCY DOMAIN-BASED PRINTABLE CHIPLESS RADIO FREQUENCY IDENTIFICATION (RFID) TAG OF QUADRILATERAL OPEN RESONATOR

(71) Applicant: GUANGXI UNIVERSITY, Nanning (CN)

(72) Inventors: Jianxin Deng, Nanning (CN); Shenglin Deng, Nanning (CN); Weibo Tang, Nanning (CN); Yefu Li, Nanning (CN); Zhanghua Nong, Nanning (CN); Hanyang Zhang, Nanning (CN); Deqiang He, Nanning (CN); Xianwang Li, Nanning (CN); Yanyun Yang, Nanning (CN); Bolin Dai, Nanning (CN)

(73) Assignee: GUANGXI UNIVERSITY, Nanning (CN)

( * ) Notice: Subject to any disclaimer, the term of this patent is extended or adjusted under 35 U.S.C. 154(b) by 0 days.

(21) Appl. No.: 19/027,463

(22) Filed: Jan. 17, 2025

(65) Prior Publication Data

US 2025/0245467 A1      Jul. 31, 2025

(30) Foreign Application Priority Data

Jan. 30, 2024     (CN) .......................... 202410130717.1

(51) Int. Cl.
*G06K 19/07* (2006.01)
*H05K 3/12* (2006.01)
(52) U.S. Cl.
CPC ........... *G06K 19/0723* (2013.01); *H05K 3/12* (2013.01)

(58) Field of Classification Search
CPC ............................. G06K 19/0723; H05K 3/12
USPC ......................................................... 235/492
See application file for complete search history.

(56) References Cited

U.S. PATENT DOCUMENTS

| | | | | |
|---|---|---|---|---|
| 6,265,977 | B1 * | 7/2001 | Vega ................ | G06K 19/07786 29/601 |
| 10,210,448 | B2 * | 2/2019 | Gibson ................ | G06K 19/073 |
| 2015/0021402 | A1 * | 1/2015 | Finn ..................... | H01Q 1/2225 235/492 |
| 2015/0170013 | A1 * | 6/2015 | Wilson ................ | G05B 19/188 235/468 |
| 2021/0083360 | A1 * | 3/2021 | Ge ......................... | H05K 3/125 |

* cited by examiner

*Primary Examiner* — Michael G Lee
*Assistant Examiner* — David Tardif
(74) *Attorney, Agent, or Firm* — Tutunjian & Bitetto, P.C.

(57) ABSTRACT

Provided is a frequency domain-based printable chipless radio frequency identification (RFID) tag of a quadrilateral open resonator, and belongs to the field of radio frequency identification. The frequency domain-based printable chipless RFID tag of a quadrilateral open resonator includes a rectangular dielectric substrate having a metal grounding layer disposed at a bottom thereof. Four groups of quadrilateral open resonance units and two parallel symmetrical antennae are disposed above the rectangular dielectric substrate, and each group of quadrilateral open resonance units are symmetrically disposed on two sides of the two parallel symmetrical antennae. The present disclosure utilizes the quadrilateral open resonator to encode data, and capacitance and inductance of the resonance unit can be adjusted, so that the tag has the advantages of convenient encoding, high encoding density, and miniaturization.

9 Claims, 5 Drawing Sheets

FREQUENCY DOMAIN-BASED PRINTABLE CHIPLESS RADIO FREQUENCY IDENTIFICATION (RFID) TAG OF QUADRILATERAL OPEN RESONATOR

CROSS REFERENCE TO RELATED APPLICATION

This patent application claims the benefit and priority of Chinese Patent Application No. 202410130717.1, filed with the China National Intellectual Property Administration on Jan. 30, 2024, the disclosure of which is incorporated by reference herein in its entirety as part of the present application.

TECHNICAL FIELD

The present disclosure relates to the field of radio frequency identification, and in particular to a frequency domain-based printable chipless radio frequency identification (RFID) tag of a quadrilateral open resonator.

BACKGROUND

With the rapid development of the Internet of Things, a variety of system environment applications are increasingly complex. The traditional radio frequency identification (RFID) technology is gradually unable to meet the application requirements. The RFID technology implements data acquisition and information transmission by means of electromagnetic signals, has advantages such as being easy to read, and is widely used in fields of smart catering, smart logistics, library management, and the like. However, traditional RFID tags have challenges in stability and reliability in complex environments. In addition, the traditional RFID tags have the disadvantages of long manufacturing periods of chips, large volumes, and high costs. As a result, they are difficult to meet demands. Therefore, a chipless RFID tag emerges. The chipless RFID tag has no chip, has the advantages of low costs, miniaturization, and strong anti-interference, and can work normally in harsh environments. However, the chipless RFID tag needs to be improved in terms of a coding capacity, density, and a reading distance. The chipless RFID technology provides a new opportunity for the development of the Internet of Things. The widespread popularization of the chipless RFID tags is extremely important in the development of the Internet of Things.

SUMMARY

The purpose of the present disclosure is to provide a frequency domain-based printable chipless RFID tag of a quadrilateral open resonator.

In order to achieve the objective above, the present disclosure has the following technical solutions.

A frequency domain-based printable chipless RFID tag of a quadrilateral open resonator, including a rectangular dielectric substrate, where a metal grounding layer is disposed at a bottom of the rectangular dielectric substrate, four groups of quadrilateral open resonance units and two parallel symmetrical antennae are disposed above the rectangular dielectric substrate, and each group of quadrilateral open resonance units are symmetrically disposed on two sides of the two parallel symmetrical antennae. The rectangular dielectric substrate is disposed on an upper surface of the metal grounding layer, and a quadrilateral open resonator is disposed on the rectangular dielectric substrate. The quadrilateral open resonator is formed by stacking four groups of symmetrical quadrilateral open resonance units. The two parallel symmetrical antennae are disposed in a middle of each group of resonators, and two ends of the antenna are transceiver ports.

Further, the metal grounding layer is rectangular as a whole, and the metal grounding layer covers the antenna.

Further, where each group of quadrilateral open resonance units includes two quadrilateral open resonance units, the two quadrilateral open resonance units in each group are symmetrically disposed on the two sides of the antennae, in two adjacent quadrilateral open resonance units, a notch of one quadrilateral open resonance unit is opposite to a notch of the other quadrilateral open resonance unit, and each quadrilateral open resonance unit has a rectangular inductor disposed on one side and one notch provided on the other side.

Further, a distance between the quadrilateral open resonance unit and an antenna adjacent to the quadrilateral open resonance unit is 0.5 mm.

Further, a distance between each two adjacent quadrilateral open resonance units on a same side of the antenna is 2 mm.

Further, opening directions of the two adjacent quadrilateral open resonance units are opposite to each other, and opening directions of the two quadrilateral open resonance units in each group are the same.

Further, the rectangular dielectric substrate has a relative dielectric constant of 4.6, a tangent of a loss angle of 0.016, and a thickness of 0.4 mm.

Further, the metal grounding layer, the quadrilateral open resonance unit, and the antenna are all made of copper, and each have a thicknesses of 0.4 mm.

Further, the chipless RFID tag is manufactured via a microelectronic printer.

Further, a manufacturing method is to print via the microelectronic printer, a material of a resonator is conductive ink, and a material of a base is polyethylene terephthalate (PET) or a paper.

The present disclosure has the following beneficial effect due to the adoption of the above technical solutions:

(1) In the present disclosure, different resonant frequencies can be obtained by changing a length of an opening side of a quadrilateral opening microstrip resonator and changing lengths and a quantity of embedded encoding strips. An ultra-wideband reader generates an ultra-wideband transmit signal with a uniform spectrum by means of generating a circuit due to a pulse. A receive circuit receives a signal whose spectral structure is changed via the tag, processes the signal, and performs demodulation to obtain encoding information using an algorithm. Therefore, a structure and a manufacturing process of the tag are simple, costs are low, and the tag is free of maintenance and can be reused. An encoded tag has a working frequency band of 1 GHz to 7 GHz, a size of 15×40×1.2 mm$^3$, and an encoding capacity of 8 bits. The tag has a high utilization rate of a spectrum and a high capacity, and is miniaturized. Therefore, the use costs of the tag are greatly reduced, convenience of manufacturing and using the tag is improved, popularity is improved, and the tag has a specific engineering practical value.

(2) The present disclosure utilizes the quadrilateral open resonator to encode data, and capacitance and inductance of the resonance unit can be adjusted, so that the tag has the advantages of convenient encoding, high encoding density, and miniaturization. Because scalability of encoded bits is enhanced, performance is more stable, and a high encoding capacity and miniaturization of the tag are ensured while a high bandwidth is implemented. The microelectronic printer is used to manufacture the tag, so that costs of the tag are reduced.

DETAILED DESCRIPTION OF THE EMBODIMENTS

To make the objectives, technical solutions and advantages of the present disclosure clearer, the present disclosure is described in further detail below with reference to the accompanying drawings and embodiments. However, it should be noted that many details listed in the specification are merely used to help a reader to understand one or more aspects of the present disclosure thoroughly, and the aspects of the present disclosure can also be implemented without these specific details.

Referring to FIG. 1 to FIG. 8, a frequency domain-based printable chipless RFID tag of a quadrilateral open resonator, RFID Signature includes a rectangular dielectric substrate 1, where a grounded metal layer 6 is disposed at a bottom of the rectangular dielectric substrate, four groups of quadrilateral open resonance units 4 and two parallel symmetrical antennae 5 are disposed above the rectangular dielectric substrate, and each group of quadrilateral open resonance units are symmetrically disposed on two sides of the two parallel symmetrical antennae.

Figure 1:
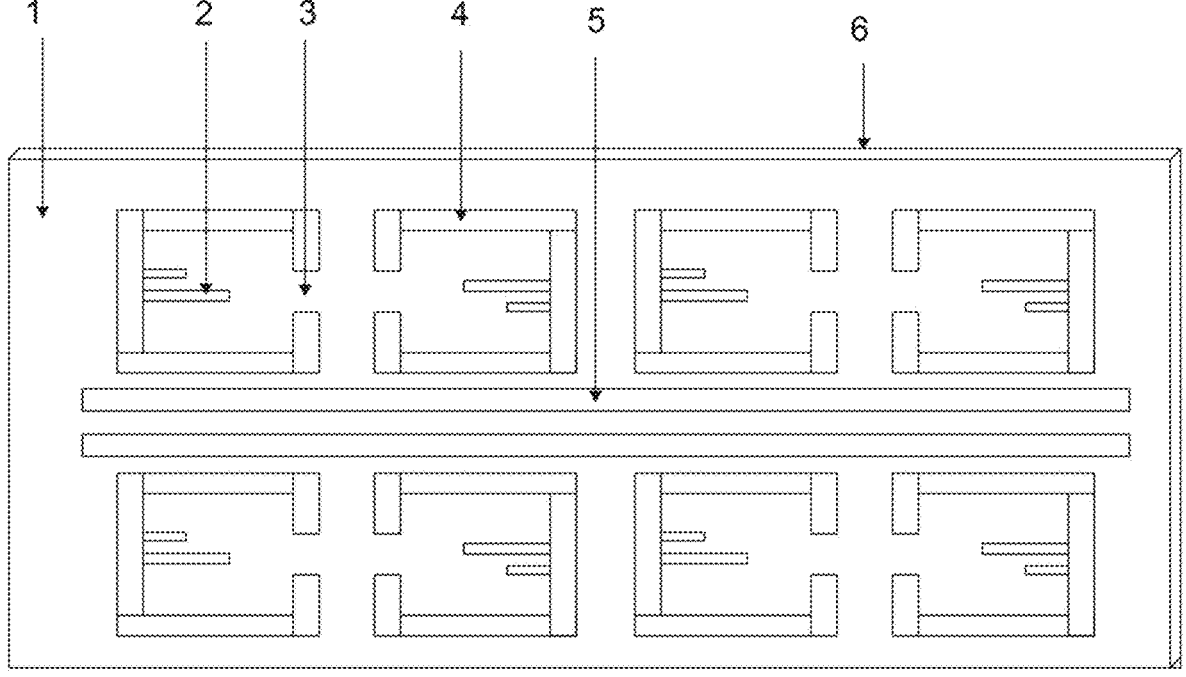
FIG. 1 is an overall structural view of a chipless RFID tag according to the present disclosure.

A frequency domain-based printable chipless RFID tag of a quadrilateral open resonator provided in this embodiment, as shown in FIG. 1, mainly includes two parallel symmetrical antennae and a chipless RFID tag, and further includes: a metal grounding layer 6, eight quadrilateral open resonance units 4, a rectangular dielectric substrate 1, and two parallel symmetrical antennae 5. The rectangular dielectric substrate is disposed above the metal grounding layer. The quadrilateral open resonance units and the two parallel symmetrical antennae are disposed above the dielectric substrate.

As in FIG. 1, the metal grounding layer is disposed at the bottom of the dielectric layer, and the quadrilateral open resonance units and the two parallel symmetrical antennae are disposed on the surface of the dielectric layer. The dielectric layer is rectangular. Three groups of notch-type open resonance units are disposed on one of long edges of an L-type transmission microstrip line, and each group of quadrilateral open resonance units are symmetrically disposed on two sides of the two parallel symmetric antennae.

Figure 2:
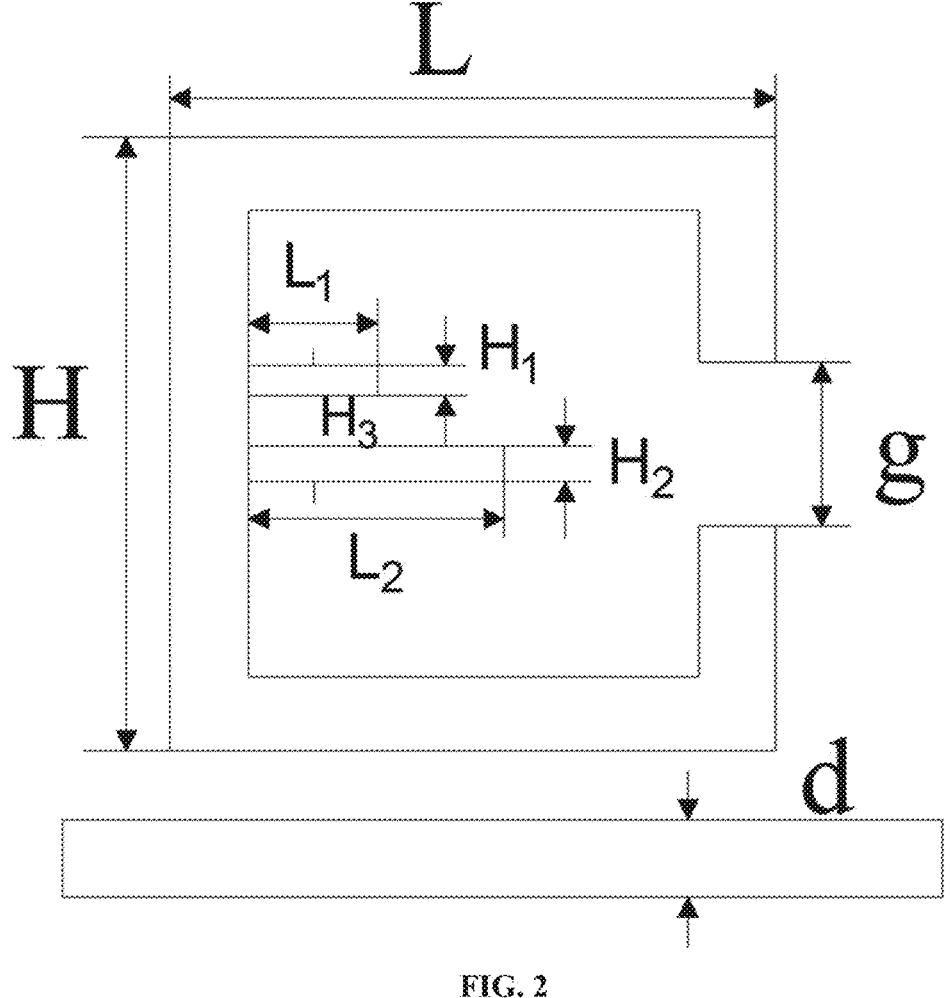
FIG. 2 is a diagram of a basic structure of a quadrilateral open resonance unit according to the present disclosure.

As shown in FIG. 2, the quadrilateral open resonance unit is formed by connecting a first longitudinal portion, a first transverse portion, a second longitudinal portion, a third longitudinal portion, a second transverse portion, a third transverse portion, and a fourth transverse portion in sequence. Transverse portions and longitudinal portions are perpendicular to each other. A length (the length is H-g/2) of the second longitudinal portion is equal to a length of the third longitudinal portion, and the first transverse portion is equal to the second transverse portion (a length is L). Left ends of the third transverse portion (a length is L1, and a width is H1) and the fourth transverse portion (a length is L2, and a width is H2) are connected on a right side of the first transverse portion. A distance between the third transverse portion and the fourth transverse portion is H3, a sum of the lengths of the second longitudinal portion and the third longitudinal portion plus an opening gap (a length is g, and g>0) equals a positive height of the quadrilateral open resonance unit (a length is H). Widths of the first longitudinal portion, the first transverse portion, the second longitudinal portion, the second transverse portion, and the third longitudinal portion are all w.

FIG. 2 shows a single quadrilateral open resonance unit. The resonator may present different resonant frequencies by adjusting the lengths L1 and L2 of the third transverse portion and the fourth transverse portion and an opening size g, to implement frequency shift encoding of the tag based on the different heights H1 and H2.

The dielectric substrate of the chipless RFID tag of the quadrilateral open resonator is FR-4, with a relative dielectric constant of 4.6, a tangent of a loss angle of 0.016, and a thickness of 0.4 mm. The metal grounding layer, the quadrilateral open resonance unit, and the antenna are all made of copper, and each have a thicknesses of 0.4 mm.

Figure 3:
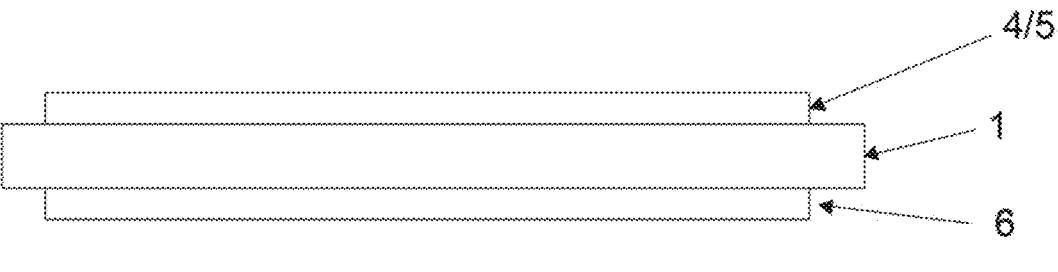
FIG. 3 is a profile of an RFID tag according to the present disclosure.

FIG. 3 is a profile of the RFID tag. The rectangular dielectric substrate is disposed above the metal grounding layer, and the quadrilateral open resonance unit and the two parallel symmetrical antennae are disposed above the dielectric substrate.

In this embodiment, specific implementation parameters of one quadrilateral open resonance unit are shown in Table 1 below:

TABLE 1

| Parameters of quadrilateral open resonance unit | | | | | | |
|---|---|---|---|---|---|---|
| Parameter | k | h | r | g | j | s | m |
| Dimension/mm | 20 | 4 | 4 | 1 | 1.5 | 0.2 | 1 |

Figure 4:
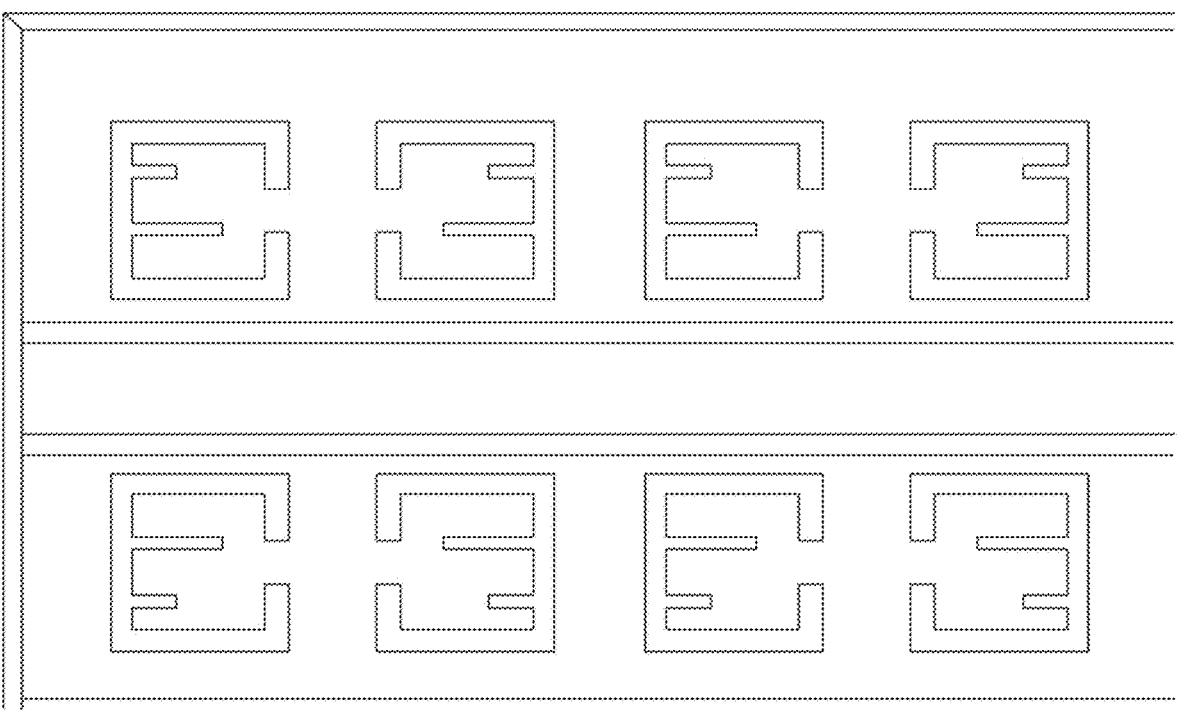
FIG. 4 is a diagram of a simulation model of an RFID tag according to the present disclosure.
Figure 5:
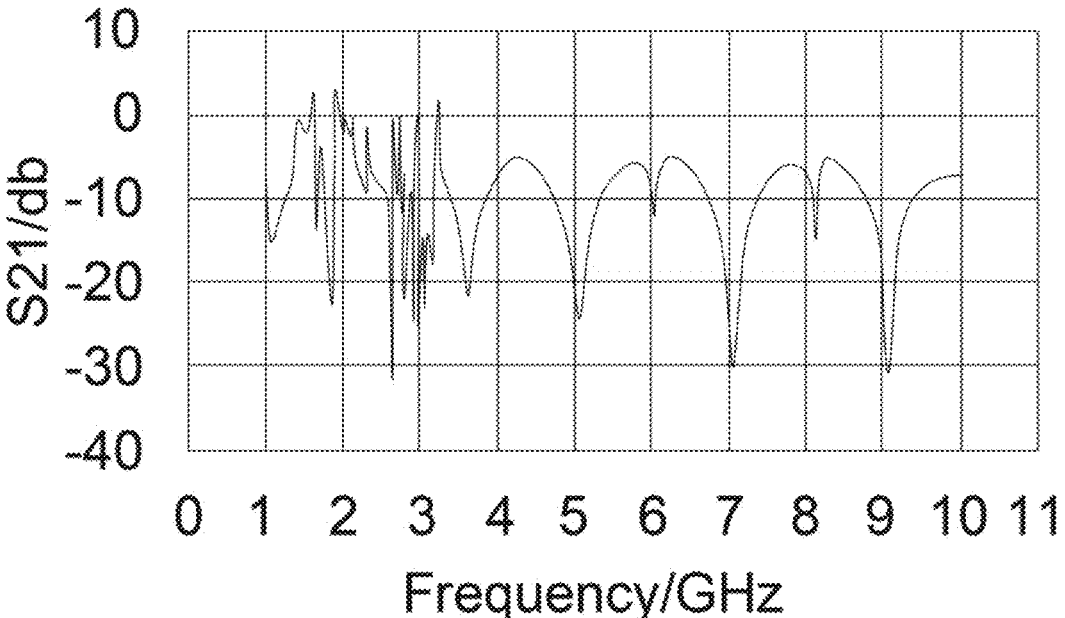
FIG. 5 is a diagram of S11 curve parameters of an RFID tag according to the present disclosure.

FIG. 4 is a diagram of an RFID tag model. Simulated analysis is performed on S21 (insertion loss) of the chipless RFID tag of the quadrilateral open resonator based on the parameters in Table 1 using HFSS, and results of the analysis are as follows:

FIG. 5 shows an encoding frequency feature curve of the chipless RFID tag of the quadrilateral open resonator. A total of eight resonance units with different heights are disposed on two sides of the antenna, and a distance between adjacent resonance units is 0.2 mm. Code of the tag is ID01101010, which can be clearly identified, and the resonance effect is good.

Figure 6:
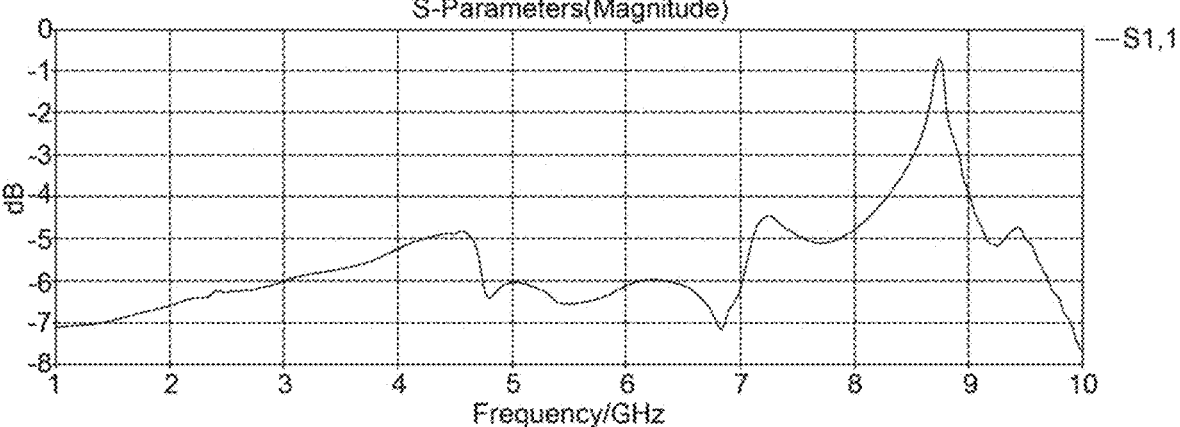
FIG. 6 is a diagram of S21 curve parameters of an RFID tag according to the present disclosure.

FIG. 6 is a diagram of S11 parameters of a positive hexagonal monopole antenna that receives and sends the chipless RFID tag. It can be learned from the simulation diagram that S11 is 1 GHz to 7.82 GHz below −5 dB, which can completely satisfy a resonance band of the tag.

Figure 7:
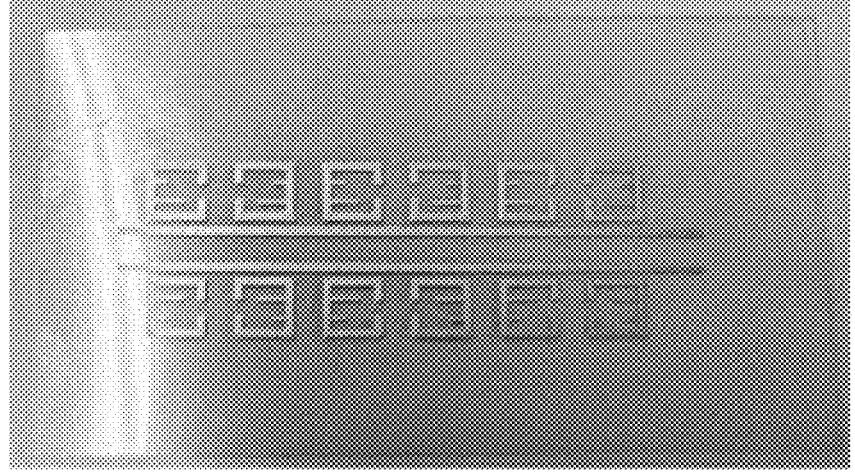
FIG. 7 is a printed physical diagram of an RFID tag with a PET substrate according to the present disclosure.

FIG. 7 is a physical diagram of a chipless RFID tag printed via a microelectronic printer. A material of a tag resonator is conductive ink, and a material of a base is PET.

Figure 8:
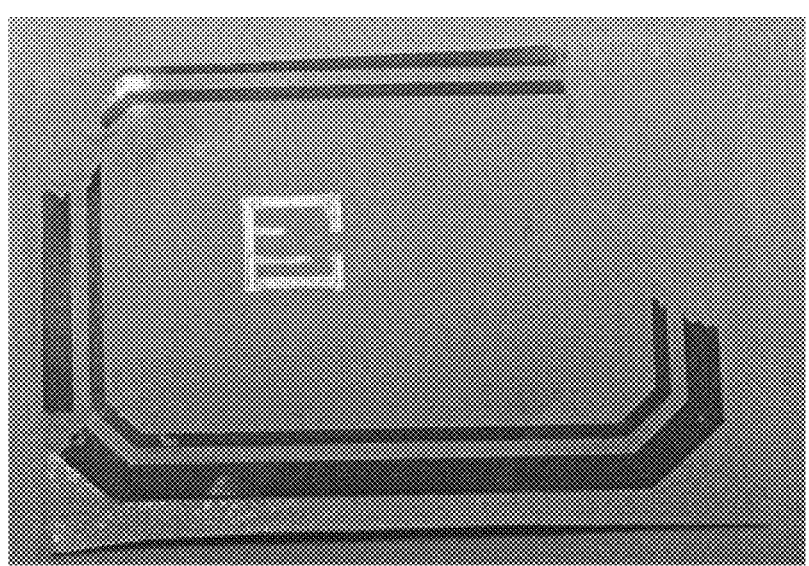
FIG. 8 is a printed physical diagram of an RFID tag with a papery substrate according to the present disclosure.

FIG. 8 is a physical diagram of a chipless RFID tag printed via a microelectronic printer. A material of a tag resonator is conductive ink, and a material of a base is a paper.

Although the embodiments of the present disclosure have been illustrated and described, it should be understood that those of ordinary skill in the art may make various changes, modifications, replacements and variations to the above embodiments without departing from the principle and spirit of the present disclosure, and the scope of the present disclosure is limited by the appended claims and their legal equivalents.

Content not mentioned in the present disclosure shall be a widely-known technology.

The foregoing description is only preferred implementation of the present disclosure. It should be noted that a person of ordinary skill in the art can also make several improvements and modifications without departing from the principle of the present disclosure. These improvements and modifications should also be deemed as falling within the protection scope of the present disclosure.

What is claimed is:

1. A frequency domain-based printable chipless radio frequency identification (RFID) tag of a quadrilateral open resonator, comprising:

a rectangular dielectric substrate having a metal grounding layer disposed at a bottom of the rectangular dielectric substrate, four groups of quadrilateral open resonance units and two parallel symmetrical antennae are disposed above the rectangular dielectric substrate, and each group of quadrilateral open resonance units are symmetrically disposed on two sides of the two parallel symmetrical antennae; wherein a distance between the quadrilateral open resonance unit and an antenna adjacent to the quadrilateral open resonance unit is 0.5 mm.

2. The frequency domain-based printable chipless RFID tag of a quadrilateral open resonator according to claim 1, wherein the metal grounding layer is rectangular as a whole, and the metal grounding layer covers the antenna.

3. The frequency domain-based printable chipless RFID tag of a quadrilateral open resonator according to claim 1, wherein each group of quadrilateral open resonance units comprises two quadrilateral open resonance units, the two quadrilateral open resonance units in each group are symmetrically disposed on the two sides of the antennae, in two adjacent quadrilateral open resonance units, a notch of one quadrilateral open resonance unit is opposite to a notch of another quadrilateral open resonance unit, and each quadrilateral open resonance unit has a rectangular inductor disposed on one side and one notch provided on another side.

4. The frequency domain-based printable chipless RFID tag of a quadrilateral open resonator according to claim 1, wherein a distance between each two adjacent quadrilateral open resonance units on a same side of the antenna is 2 mm.

5. The frequency domain-based printable chipless RFID tag of a quadrilateral open resonator according to claim 3, wherein opening directions of the two adjacent quadrilateral open resonance units are opposite to each other and opening directions of the two quadrilateral open resonance units in each group are the same.

6. The frequency domain-based printable chipless RFID tag of a quadrilateral open resonator according to claim 1, wherein the rectangular dielectric substrate has a relative dielectric constant of 4.6, a tangent of a loss angle of 0.016, and a thickness of 0.4 mm.

7. The frequency domain-based printable chipless RFID tag of a quadrilateral open resonator according to claim 1, wherein the metal grounding layer, the quadrilateral open resonance unit, and the antenna are all made of copper, and each have a thickness of 0.4 mm.

8. The frequency domain-based printable chipless RFID tag of a quadrilateral open resonator according to claim 1, wherein the chipless RFID tag is manufactured via a microelectronic printer.

9. The frequency domain-based printable chipless RFID tag of a quadrilateral open resonator according to claim 8, wherein a manufacturing method is to print via the microelectronic printer, wherein a material of a resonator is conductive ink, and a material of a base is polyethylene terephthalate (PET) or a paper.

* * * * *